(12) United States Patent
Kim et al.

(10) Patent No.: US 9,837,245 B2
(45) Date of Patent: Dec. 5, 2017

(54) MICRO STAGE FOR PARTICLE BEAM COLUMN USING PIEZO ELEMENTS AS ACTUATOR

(71) Applicants: Ho Seob Kim, Incheon (KR); Byeng Jin Kim, Incheon (KR); Do Jin Seong, Seoul (KR)

(72) Inventors: Ho Seob Kim, Incheon (KR); Byeng Jin Kim, Incheon (KR); Do Jin Seong, Seoul (KR)

(73) Assignee: CEBT CO., LTD., Asan-si, Chungcheongnam-Do (KR)

( * ) Notice: Subject to any disclaimer, the term of this patent is extended or adjusted under 35 U.S.C. 154(b) by 42 days.

(21) Appl. No.: 14/657,234

(22) Filed: Mar. 13, 2015

(65) Prior Publication Data

US 2016/0268929 A1    Sep. 15, 2016

(51) Int. Cl.
| | |
|---|---|
| *G21K 5/10* | (2006.01) |
| *H01J 37/26* | (2006.01) |
| *H01J 37/20* | (2006.01) |
| *H01J 37/10* | (2006.01) |
| *H02N 2/00* | (2006.01) |
| *H02N 2/02* | (2006.01) |

(52) U.S. Cl.
CPC ............ *H01J 37/261* (2013.01); *H01J 37/10* (2013.01); *H01J 37/20* (2013.01); *H02N 2/006* (2013.01); *H02N 2/026* (2013.01); *H01J 2237/10* (2013.01); *H01J 2237/20264* (2013.01); *H01J 2237/2602* (2013.01)

(58) Field of Classification Search
CPC ............ H02N 2/00; H02N 2/02; H02N 2/028; H02N 2/04
USPC ............. 250/442.11, 306; 248/614, 613, 560
See application file for complete search history.

(56) References Cited

U.S. PATENT DOCUMENTS

| | | | | |
|---|---|---|---|---|
| 5,153,434 A | * | 10/1992 | Yajima | H01J 37/266 250/311 |
| 2008/0211349 A1 | * | 9/2008 | Seya | H01J 37/20 310/323.02 |
| 2010/0115671 A1 | * | 5/2010 | Pryadkin | G01B 11/03 850/1 |

FOREIGN PATENT DOCUMENTS

| | | |
|---|---|---|
| KR | 10-2003-0063376 A1 | 2/2005 |
| KR | 10-0687717 B1 | 11/2011 |

* cited by examiner

*Primary Examiner* — Jason McCormack
(74) *Attorney, Agent, or Firm* — John K. Park; Park Law Firm

(57) ABSTRACT

Disclosed herein is a micro stage using a piezoelectric element that can be reliably operated even in a vacuum environment. In a particle column requiring a high precision, for example, a microelectronic column, the micro stage can be used as a stage with micro or nano degree precision for alignment of parts of the column, or for moving a sample, and so on.

8 Claims, 6 Drawing Sheets

MICRO STAGE FOR PARTICLE BEAM COLUMN USING PIEZO ELEMENTS AS ACTUATOR

FIELD OF THE INVENTION

The present invention generally relates to micro stages using piezoelectric elements and, more particularly, to a micro stage using a piezoelectric element that can be reliably operated even under vacuum.

DESCRIPTION OF THE RELATED ART

Generally, piezoelectric elements are used as actuators of stages having micro, nano or higher-degree precision. Such piezoelectric stages have high precision and are typically used when there is a need for small movement with nano or higher-degree precision.

Meanwhile, use of stages is limited in a vacuum environment. For example, in a vacuum the use of stages using rotating drive motors is limited because a lubricant such as grease is used in the rotating drive devices. Furthermore, in the case of such stages using rotating drive motors, improvement in operation precision and a reduction in size are limited.

Particle beam columns such as micro electronic columns, which require high precision for fabrication and operation, must use a micro or nano-level stage with high precision when aligning parts of a column or moving a sample, etc. Furthermore, such particle beam columns including micro columns are used in a vacuum environment. Given this, stages with high precision must be reliably operated even in a vacuum environment.

However, in a vacuum environment, particularly, in ultrahigh vacuum environment, attractive force between contact objects is increased. Thus, because attractive force between parts of a stage is increased, it becomes very difficult to finely operate the stage. Therefore, a stage in which a piezoelectric element can be reliably operated with high precision as an actuator even in vacuum environment is required.

A micro column, which is an example of a particle beam column, focuses a particle beam generated from a particle emission source and scans the particle beam onto a sample. Depending on the kind of sample, the case of detecting ions or electrons using a sample current method may be employed. The sample current method makes it possible to directly detect and check ions or electrons scanned directly onto the sample because a conductor part of the sample is connected to the outside. Such a sample current method can be used to inspect via/contact holes of semiconductor devices, to inspect and analyze the surfaces of samples, and to inspect a TFT (thin film transistor) of a TFT-LCD device.

Meanwhile, in the case of such micro columns, there is the possibility of deformation of some parts of a micro column during a manufacturing process. A source lens from which particles generated from the particle emission source is emitted to the outside must correctly form a particle beam path so as to reliably focus particles onto the sample. Given these, to satisfactorily apply a particle beam onto the sample, the position of the particle emission source from which a beam is emitted must be adjusted so that the beam can be reliably applied onto the sample after correctly passing through intermediate lenses. For this, there may be a need for adjustment of the position of the particle emission source. The adjustment mainly pertains to moving the particle emission source in X-Y directions.

However, because there is the likelihood of misalignment of a beam emitted from the particle emission source when the particle emission source is moved, a stage for particle emission sources that can realign the particle emission source, even while the stage is used, as well as during a manufacturing process, is required.

PATENT LITERATURE (Patent Literature 1) Registered Patent KR10-0687717
(Patent Literature 2) Patent Application No. KR 10-2003-0063376

DISCLOSURE OF INVENTION

Problem to Solve

Accordingly, the present invention has been made keeping in mind the above problems occurring in the prior art, and an object of the present invention is to provide a micro stage that uses a piezoelectric element as an actuator and can be reliably operated even under vacuum.

Another object of the present invention is to provide a micro stage in which a downward and outward inclined surface is formed on each of the opposite sides of a movable body so that force applied from both sides to the movable body also pushes the movable body downward, thus making it possible for the movable body to move without wobbling.

A further object of the present invention is to provide a micro stage that uses a piezoelectric element to move a particle emission source, electronic lenses, a sample, etc., whereby the movement of the particle emission source can be reliably conducted.

Yet another object of the present invention is to provide a micro stage in which, as the particle emission source is moved, the aligned state of the particle emission source and the lenses can be reliably maintained such that a particle beam emitted from the particle emission source can be precisely applied onto the sample via the lenses, whereby the alignment and emission of the particle beam can be optimally conducted.

Solutions to Problem

In order to accomplish the above object, the present invention provides a micro stage including a movable body provided to move a target, and a main-body piezoelectric base to which the movable body is movably coupled. The main-body piezoelectric base includes side-surface pressurizing units for pressurizing the movable body. The movable body has inclined surfaces on portions thereof coming into contact with the respective side-surface pressurizing unit of the main-body piezoelectric base. Pressurizing force is applied from the opposite side-surface pressurizing units of the main-body piezoelectric base to opposite sides of the movable body and thus pressurizes the movable body in an inclined direction so that the movable body is pressurized onto the main-body piezoelectric base while the movable body is moved.

The micro stage may further include an inclined-surface guide bonded to one side or each of both sides of the movable body. The inclined-surface guide may form a downward and outward inclined surface and come into contact with the corresponding side-surface pressurizing unit of the main-body piezoelectric base.

The micro stage may further include a bottom support part provided on a contact surface of the main-body piezoelectric base that makes contact with the movable body. The bottom support part may support a bottom of the movable body. The bottom support part may include: a bottom pressurizing body coming into contact with the bottom of the movable body; and a bottom piezoelectric element disposed between the bottom pressurizing body and a seating surface of the main-body piezoelectric base.

Each of the side-surface pressurizing units may include: a side-surface piezoelectric element for moving the movable body; and a side-surface pressurizing body coming into contact with the side-surface piezoelectric element and pressurizing the movable body.

The side-surface pressurizing unit may further include an inward pressurizing piezoelectric element pressurizing the side-surface pressurizing body toward the movable body.

In another aspect, the present invention provides a micro stage for moving a target, the micro stage including: a main-body piezoelectric base; an intermediate piezoelectric base moving back and forth in a direction relative to the main-body piezoelectric base; and a movable body moving back and forth relative to the intermediate piezoelectric base, the movable body being provided with a particle emission source. The main-body piezoelectric base includes a side-surface pressurizing unit for moving the intermediate piezoelectric base. The intermediate piezoelectric base includes an intermediate side-surface pressurizing unit. A surface of the intermediate piezoelectric base that comes into contact with the side-surface pressurizing unit of the main-body piezoelectric base comprises a downward and outward inclined surface. A surface of the movable body that comes into contact with the intermediate side-surface pressurizing unit of the intermediate piezoelectric base comprises a downward and outward inclined surface.

Effects of Invention

The above present invention provides a micro stage that uses a piezoelectric element as an actuator and can be reliably operated with a nano-meter scale precision even under vacuum.

Also, the present invention provides a micro stage in which the interval taking place among the movable bodies is minimized, enabling precise operation of the micro stage.

Also, since the piezo keeps to move the movable body, there is no limit to the moving distance.

Also, since the voltage does not have to be applied to the piezo in a stationary state, it stays stationary more physically stably.

Also, another effect of the invention is that by forming downward tilting surfaces on both side of the movable body moving an object, it is possible to move the movable body while preventing interval from generating by applying force downward.

And another effect of the invention is to make a stable movement of the particle emission source by moving it using the pieze.

DESCRIPTION OF THE PREFERRED EMBODIMENT

Hereinafter, embodiments of the present invention will be described in detail with reference to the attached drawings.

A micro stage 100 using a piezoelectric element according to the embodiment of the present invention is a linear stage basically conducting linear movement and includes a main-body piezoelectric base 21 and a movable body 46 for use in transfer of a target.

The purpose of the present invention is to provide a stage capable of using a piezoelectric element as an actuator even in an ultra-high vacuum environment. Minimizing contact points between parts of the piezoelectric element when operated and preventing the base and the linear piezoelectric element from moving away from each other when the stage is operated are the principle concepts of the present invention. That is, the micro stage according to the present invention is a stage that maintains the distance between the main-body piezoelectric base and the movable body constant, and minimizes a contact area therebetween.

Figure 1:
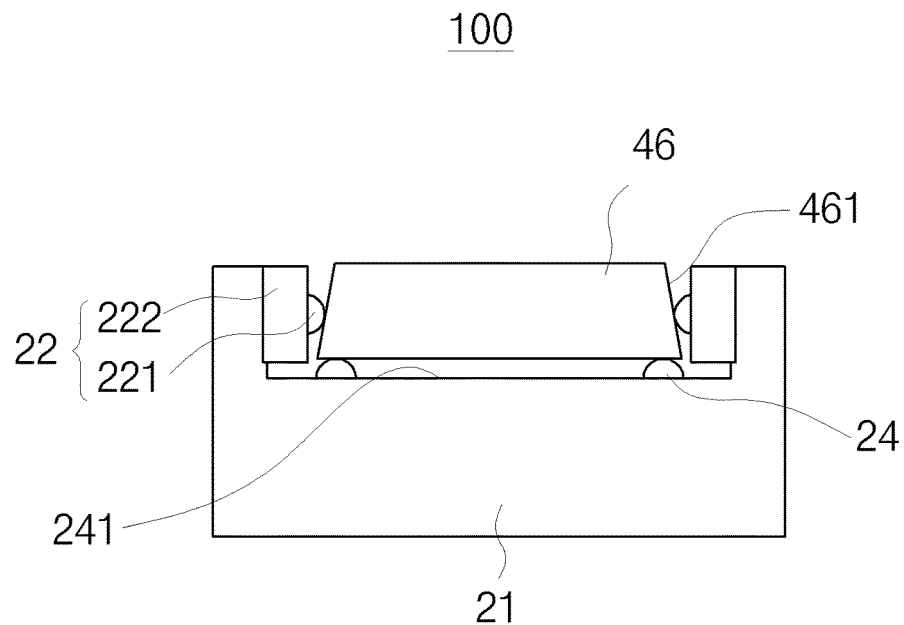
FIG. 1 is a view illustrating the coupling relationship between a main-body piezoelectric base of a micro stage and a movable body having a simple downward and outward inclined surface according to an embodiment of the present invention, corresponding to a sectional view taken along line A-A of FIG. 11.
Figure 10:
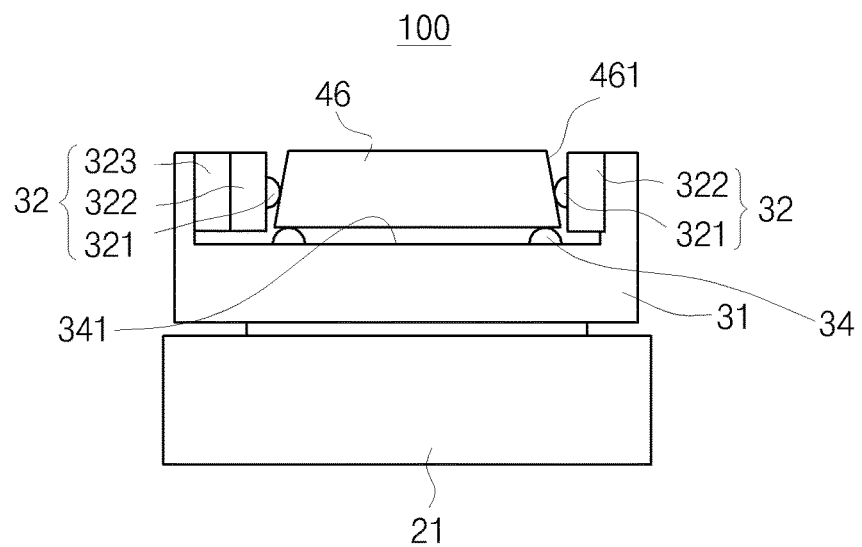
FIG. 10 is a view illustrating a micro stage in which an intermediate-inward-pressurizing piezoelectric element is provided on an intermediate piezoelectric base according to still another embodiment of the present invention.
Figure 11:
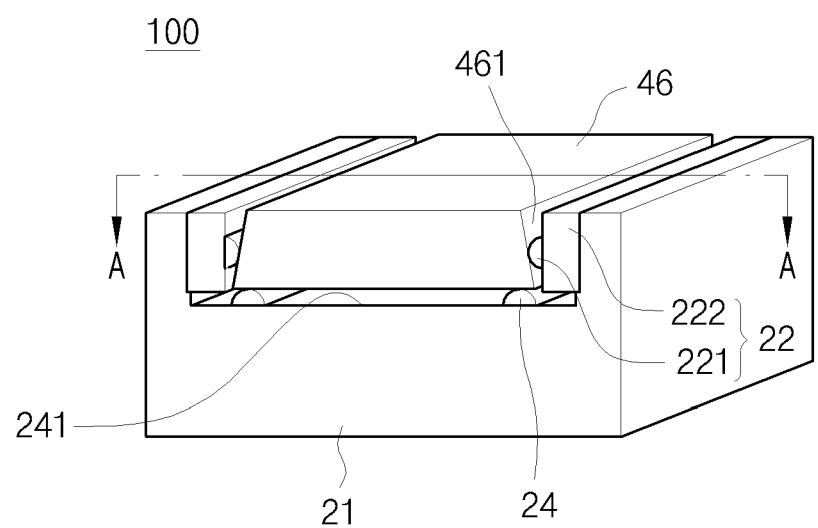
FIG. 11 is a perspective view of the micro stage according to the present invention based on FIG. 1.

FIG. 1 is a sectional view illustrating a basic linear micro stage according to the present invention, and FIG. 11 is a perspective view thereof. The main-body piezoelectric base 21 is a main-body piezoelectric base for the movable body 46. Stages of FIGS. 2 through 10 are also configured in shapes corresponding to that of FIG. 11.

The main-body piezoelectric base 21 includes side-surface pressurizing units 22 that are used to move the movable body 46. Each side-surface pressurizing unit 22 includes a side-surface pressurizing body 221 and a side-surface piezoelectric element 222. The movable body 46 is moved relative to the-body main-body piezoelectric base 21 by the operation of the side-surface piezoelectric element 222. Given this, it is desirable that the side-surface piezoelectric element 222 be a shear mode piezoelectric element. The shear mode piezoelectric element is operated such that the movable body 46 can be moved in a transverse direction of the main-body piezoelectric base 21. The operation method of the piezoelectric element is similar or equal to that of the conventional piezoelectric stage. Therefore, a detailed description thereof will be omitted.

As shown in the drawings, a surface of the movable body 46 that faces the side-surface pressurizing body 221 of the side-surface pressurizing unit 22 is inclined downward such that a horizontal cross-sectional area of the movable body 46 is increased from the top to the bottom, that is, toward the surface of the main-body piezoelectric base 21 that faces the movable body 46. Due to the downward and outward inclined surface of the movable body 46, the movable body 46 is biased toward the main-body piezoelectric base 21 so that the movable body can be maintained in close contact with contact parts of the main-body piezoelectric base 21. Thereby, because the close contact state of the movable body 46 can be maintained even when moving, the movable body 46 can be prevented from wobbling or moving away from the main-body piezoelectric base 21. The downward and outward inclined surface may be formed on either side of the movable body 46 or each of the opposite sides thereof. That is, although only any one side of the movable body 46 may have a downward and outward inclined surface while the other side thereof has a vertical surface, it is desirable that the opposite side surfaces of the movable body 46 that face the respective side-surface pressurizing units 22 each comprise a downward and outward inclined surface, as shown in the drawing.

As shown in FIG. 1, the movable body 46 is disposed above a central portion of the main-body piezoelectric base 21. The side-surface pressurizing units 22 that extend upward from opposite sides of the main-body piezoelectric base 21 are respectively disposed on opposite sides of the movable body 46.

Each side-surface pressurizing unit 22 includes the side-surface piezoelectric element 222 for movement operation, and the side-surface pressurizing body 221 that is moved by the side-surface piezoelectric element 222. In detail, a first side of the side-surface pressurizing body 221 comes into contact with the side-surface piezoelectric element 222, and a second side thereof comes into contact with the movable body 46. The side-surface pressurizing body 221 may be embodied in various other shapes, for example, a semicircular shape, a triangular pyramidal shape, a protrusion shape, etc.

In this embodiment, downward and outward inclined surfaces 461 are formed on the respective opposite sides of the movable body 46. The pressurizing bodies 221 of the side-surface pressurizing units 22 come into contact with the respective inclined surfaces 461 of the movable body 46. Thus, the pressurizing bodies 221 act such that the movement of the movable body 46 toward the pressurizing bodies 221 is restricted.

The bottom of the movable body 46 comes into contact with the upper surface of the central portion of the main-body piezoelectric base 21, wherein they may make surface contact with each other, or the bottom of the movable body may come into contact with protruding bottom support parts 24 provided on a seating surface 241 of the main-body piezoelectric base 21, as shown in the drawings. Each bottom support part 24 making contact with the movable body 46 may have a simple hemispheric shape or protrusion shape. Furthermore, the bottom support part having a hemispheric shape, a protrusion shape, etc. comes into contact with the bottom of the movable body 46 may be made of ruby, alumina, sapphire, steel, etc. in the same manner as that of the side-surface pressurizing body functioning to compress or support a part. Desirably, the bottom support part is made of material capable of ensuring normal operation without changing in conditions or characteristics even in a vacuum environment. Furthermore, the bottom support parts are used as a means for maintaining the movable body 46 horizontal.

Figure 2:
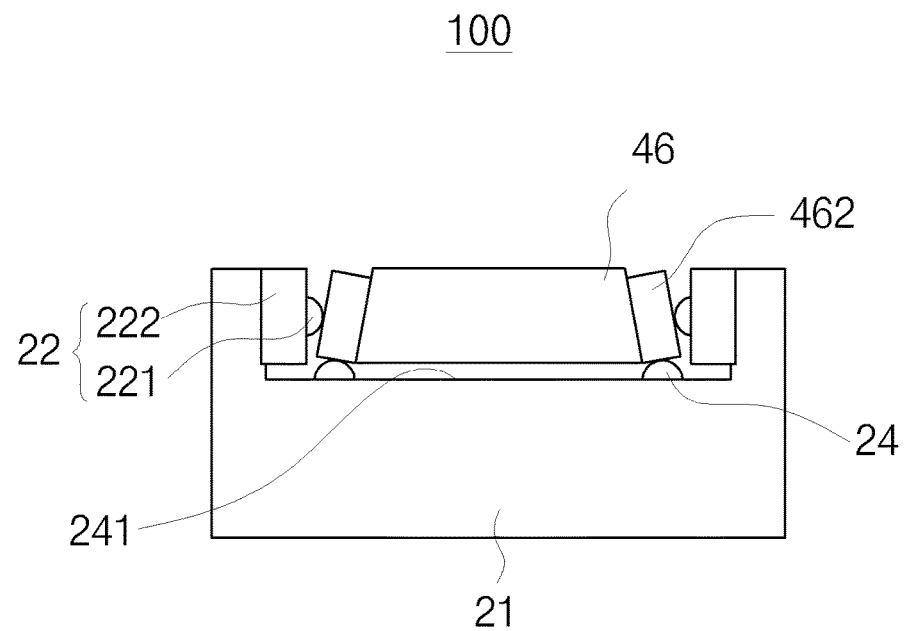
FIG. 2 is a view illustrating the coupling relationship between a main-body piezoelectric base of a micro stage and a movable body having an inclined-surface guide according to another embodiment of the present invention.

FIG. 2 is a view illustrating a micro stage 100 according to an embodiment of the present invention that includes a main-body piezoelectric base 21 and a movable body 46 provided with inclined-surface guides 462

The general construction of the micro stage 100 of FIG. 2 is the same as that of the embodiment of FIG. 1, but the inclined-surface guides 462 each forming a downward and outward inclined surface are provided on the respective opposite sides of the movable body 46, unlike the embodiment of FIG. 1. In this embodiment, each inclined-surface guide 462 has a rectangular cross-section, and each of the opposite side surfaces of the movable body 46 that respectively make contact with the inclined-surface guides 462 forms a downward and outward inclined surface. Consequently, the outer surface of each inclined-surface guide 462 also forms a downward and outward inclined surface. Alternatively, the opposite side surfaces of the movable body 46 may be vertical while only the outer surface of each of the inclined-surface guides 462 coupled to the respective opposite side surfaces of the movable body 46 may form an downward and outward inclined surface. In other words, the coupling of the inclined-surface guides 462 to the opposite side surfaces of the movable body 46 can be embodied in a variety of shapes so long as the outer surface of each inclined-surface guide 462 can be inclined downward and outward.

Other than the above-mentioned characteristics of the micro stage 100 of FIG. 2, the construction and operation of the micro stage 100 of FIG. 2 is similar or equal to that of the embodiment of FIG. 1. Therefore, further explanation is deemed unnecessary.

Figure 3:
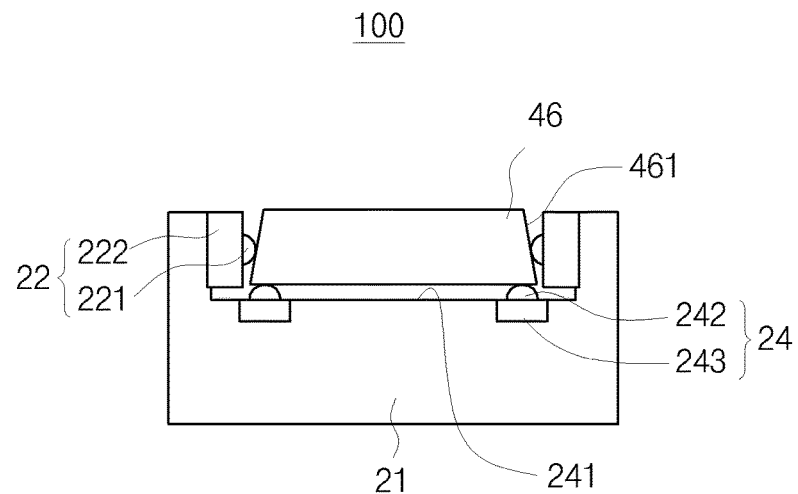
FIG. 3 is a view illustrating a micro stage in which a bottom support part is provided on a main-body piezoelectric base according to a further embodiment of the present invention.

FIG. 3 illustrates an embodiment in which at least one pair of bottom piezoelectric elements 243, each coupled to a bottom pressurization body 242, is provided and oriented in the longitudinal direction of the movable body 46.

In detail, as shown in FIG. 3, bottom support parts 24 are provided on a seating surface 241 of the main-body piezoelectric base 21 for supporting the bottom of the movable body 46. Each bottom support part 24 includes the bottom pressurization body 242 making contact with the movable body 46, and the bottom piezoelectric element 243 provided to move the bottom pressurization body 242. Desirably, the bottom piezoelectric element 243 comprises a piezoelectric element that is operated in a shear mode in the same manner as that of the piezoelectric element 222 described above.

In this embodiment, the movable body 46 that linearly moves relative to the main-body piezoelectric base 21 is operated both by the side-surface pressurizing units 22 that are disposed on the opposite sides of the movable body 46 and linearly move and pressurize the movable body 46 and by the side-surface piezoelectric elements 222 and the bottom piezoelectric elements 243 of the bottom support parts 24 that support the bottom of the movable body 46. Therefore, the linear movement of the movable body 46 relative to the main-body piezoelectric base 21 can be conducted more reliably and precisely.

Figure 4:
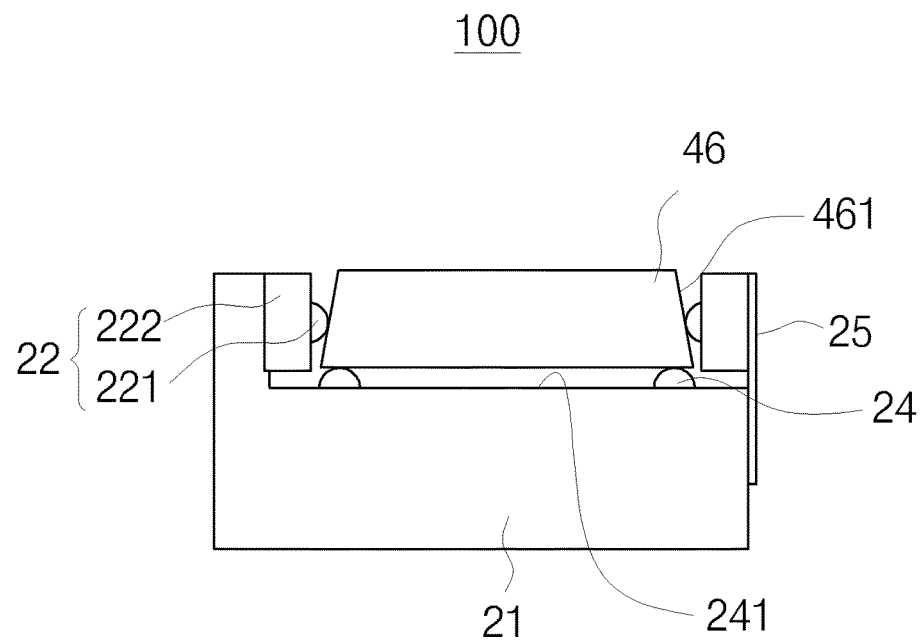
FIG. 4 is a view illustrating a micro stage in which an elastic part is provided on a main-body piezoelectric base according to yet another embodiment of the present invention.

FIG. 4 illustrates an embodiment provided with an elastic part.

In this embodiment, a side-surface pressurizing unit 22 is coupled to the main-body piezoelectric base 21 by an elastic part 25. The elastic part 25 may be provided only on either side of the main-body piezoelectric base 21 or on each of the opposite sides thereof. The elastic part 25 elastically pushes the corresponding side-surface pressurizing unit 22 toward the movable body 46 that is disposed between the side-surface pressurizing units 22. The elastic part 25 may be separately manufactured having a thin plate spring structure and then coupled to the main-body piezoelectric base 21. Alternatively, the elastic part 25 may be integrally formed with the main-body piezoelectric base 21. The force with which the opposite side-surface pressurizing bodies 221 pressurize the movable body 46 by means of the elastic part 25 also acts as force compressing the movable body 46 toward the main-body piezoelectric base from the contact parts of the inclined surfaces 461 of the movable body 46. Thus, downward force is applied to the movable body 46, whereby the movable body 46 can be more reliably maintained in contact with the main-body piezoelectric base 21.

Figure 5:
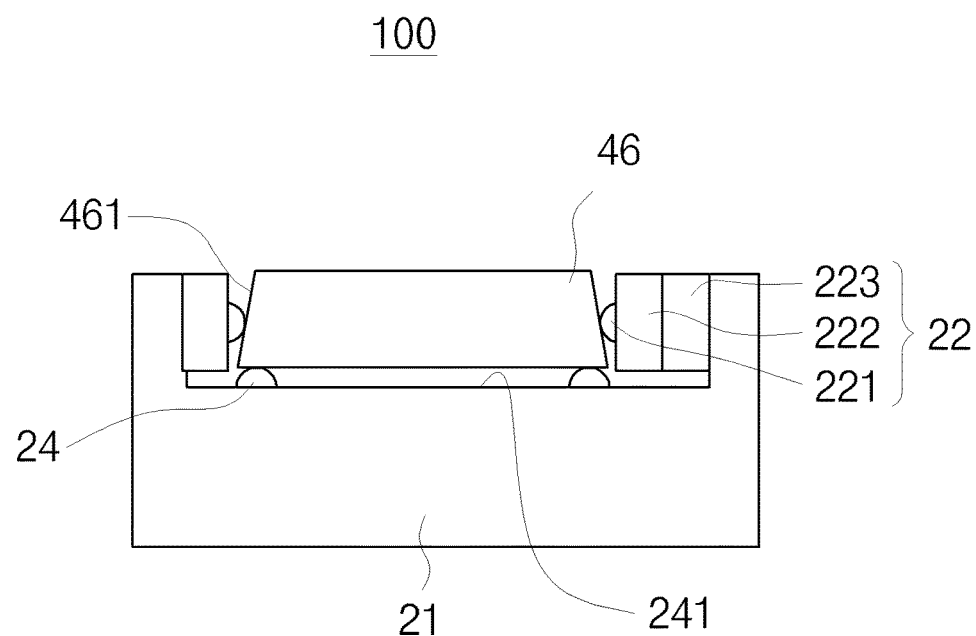
FIG. 5 is a view illustrating a micro stage in which an inward pressurizing piezoelectric element is provided on a main-body piezoelectric base according to still another embodiment of the present invention.

FIG. 5 illustrates an embodiment that further includes an inward pressurizing piezoelectric element 223, which is provided on the side-surface pressurizing body of either of the side-surface pressurizing units and pressurizes the movable body or releases it depending on whether electricity is supplied or not.

The inward pressurizing piezoelectric element 223 desirably comprises a piezoelectric element that is operated in a longitudinal mode. That is, in this embodiment, the side-surface pressurizing unit 22 that transversely pressurizes and moves the movable body 46 further includes the inward pressurizing piezoelectric element 223 that is provided on the side-surface piezoelectric element 222 and is operated in the longitudinal mode. Therefore, depending on supply of voltage to the inward pressurizing piezoelectric element 223, the side-surface pressurizing body 221 and the side-surface piezoelectric element 222 that makes contact with the inward pressurizing piezoelectric element 223 pressurize the movable body 46 or release it. During the pressurizing operation by the inward pressurizing piezoelectric element 223, contact force is applied between the movable body and the main-body piezoelectric base in the same principle as that of the embodiment with the above-mentioned elastic part. On the other hand, when the pressurizing force of the inward pressurizing piezoelectric element 223 is removed, the contact force that has been applied between the movable body and the main-body piezoelectric base is also removed.

It is desirable that the elastic force of the elastic part be determined depending on external force applied to the micro stage. As the elastic force of the elastic part is increased, the contact force between the movable body and the main-body piezoelectric base is increased, but the force of the piezoelectric element to move the movable body must also be increased. Given this, the elastic force of the elastic part is determined considering the mobility of the movable body. As the elastic force of the elastic part is reduced, the mobility of the movable body is increased, but the movable body may be undesirably moved by external force. Therefore, the elastic force of the elastic part must be adjusted depending on the purpose of use of the micro stage. Thus, when the elastic part having a comparatively high elastic force is used to increase the precision of the micro stage, it is desirable that a separate stopper (not shown) be provided to limit a range within which the elastic force of the elastic part can be applied to the movable body, and the inward pressurizing piezoelectric element be used to ensure the mobility of the movable body. Of course, this embodiment may further include the inclined-surface guide 462 of FIG. 2. However, in the case where there is a need for only low elastic force, only the elastic part may be used without the inward pressurizing piezoelectric element, or only the inward pressurizing piezoelectric element may be used without the elastic part, despite providing high precision.

In this embodiment, although using both the elastic part and the inward pressurizing piezoelectric element has been illustrated as being desirable, only one of them may be used depending on the purpose of use of the micro stage.

Furthermore, although each of the embodiments of FIGS. 1 through 5 has been illustrated as having any one of the main characteristics, an embodiment including all of the characteristics of the embodiments of FIGS. 1 through 5 can also be made. For example, although the micro stage may be embodied without having the bottom support part 24 of FIG. 1, it is not desirable. The inclined-surface guide 462 of FIG. 1, may also be used in any one of the embodiments of FIGS. 2 through 5. In addition, all of the embodiments of FIGS. 1 through 5 may be combined into a single embodiment. Furthermore, in the embodiments other than the embodiment of FIG. 3, although the side-surface pressurizing unit 22 including the piezoelectric element 222 and the side-surface pressurizing body 221 has been illustrated as being disposed only at either side of the movable body or each of the opposite sides thereof, the number of side-surface pressurizing units 22 or the positions thereof may be changed depending on the function or role of the micro stage. For instance, if there is a need for a larger number of piezoelectric elements to move the movable body 46, as in the case of a conventional micro stage, additional piezoelectric elements may be provided at appropriate positions.

In the description of the above-mentioned embodiments or following embodiments of the micro stage 100 according to the present invention, the construction of the micro stage 100 has been or will be mainly illustrated with regard to a rectangular one- or two-dimensional movement method. Using the following description and examples shown in the attached drawings, the micro stage can also be applied to a three-dimensional movement method as well as to the one- or two-dimensional movement method. For example, if two one-dimensional-movement stages are used, the two-dimensional movement method can be embodied. Likewise, if three one-dimensional-movement stages are used, a micro stage that can implement three-dimensional movement can be embodied.

FIGS. 6 through 10 respectively illustrate modifications of the one-dimensional linear micro stages of the embodiments of FIGS. 1 through 5 into two-dimensional X-Y micro stages. Among the one-dimensional linear micro stages of the embodiments of FIGS. 1 through 5, two of the same or different one-dimensional linear micro stages are appropriately selected and combined with each other to produce a two-dimensional X-Y stage in a typical manner. In the same manner, a three or more-dimensional micro stage can be manufactured.

In each of the embodiments of FIGS. 6 through 10, the movable body of corresponding one of the embodiments of FIGS. 1 through 5 is used as an intermediate piezoelectric base 31. The intermediate piezoelectric base 31 includes an intermediate side-surface pressurizing unit 32 having a structure equal or similar to that of the side-surface pressurizing unit 22. A movable body 46 is moved relative to the intermediate piezoelectric base 31. In other words, the intermediate piezoelectric base 31 is moved relative to the main-body piezoelectric base 21 in a one-dimensional direction, and the movable body 46 is moved relative to the intermediate piezoelectric base 31 in another one-dimensional direction, whereby two-dimensional movement can be embodied. If the two one-dimensional directions are perpendicular, the micro stage functions as an X-Y stage. In the same manner, a micro stage that can conduct three-dimensional movement can also be embodied.

Hereinafter, the micro stage according to the preset invention will be explained in more detail with reference to FIGS. 6 through 10. In the following description, the same operation as that of the above-described embodiments will be omitted, and the micro stage will be explained, focusing on differences between it and the above-described embodiments.

Figure 6:
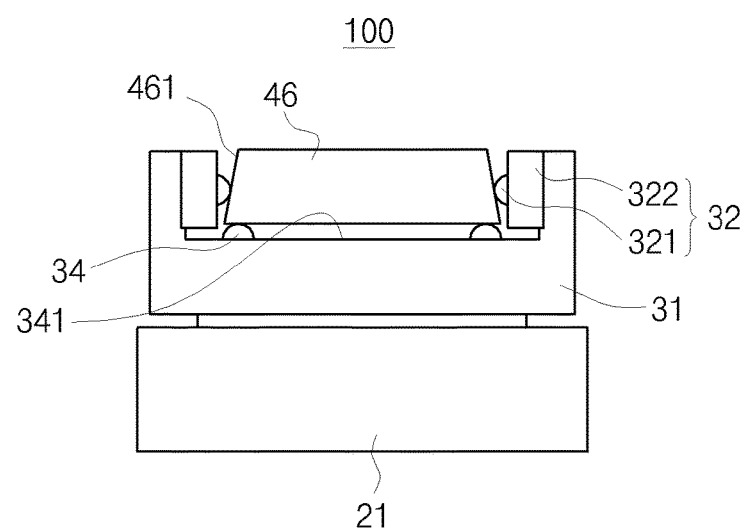
FIG. 6 is a view illustrating the coupling relationship between an intermediate piezoelectric base of a micro stage and a movable body having a simple downward and outward inclined surface according to still another embodiment of the present invention.

First, the embodiment of FIG. 6 uses the principle of the embodiment of FIG. 1. The movable body functions as an intermediate piezoelectric base. FIG. 6 is a view illustrating mainly the coupling relationship between an intermediate piezoelectric base 31 and a movable body 46 having a simple downward and outward inclined surface in the micro stage 100 according to an embodiment of the present invention. The movable body 46 is disposed on a central portion of an upper end of the intermediate piezoelectric base 31. Intermediate side-surface pressurizing units 32 that extend upward from opposite sides of the intermediate piezoelectric base 31 are respectively disposed on opposite sides of the movable body 46. Each intermediate side-surface pressurizing unit 32 includes an intermediate side-surface piezoelectric element 322 for movement operation, and an intermediate side-surface piezoelectric element 322 that is moved by the intermediate side-surface piezoelectric element 322. In detail, a first side of the intermediate side-surface pressurizing body 321 comes into contact with the intermediate side-surface piezoelectric element 322, and a second side thereof comes into contact with the movable body 46. Desirably, the intermediate side-surface piezoelectric element 322 comprises a piezoelectric element that is operated in a shear mode in the same manner.

The intermediate side-surface pressurizing body 321 may be embodied in other various shapes, for example, a semicircular shape, a triangular pyramidal shape, a protrusion shape, etc. In this embodiment, downward and outward inclined surfaces 461 are formed on the respective opposite sides of the movable body 46. The intermediate side-surface pressurizing bodies 321 of the intermediate side-surface pressurizing units 32 come into contact with the respective inclined surfaces 461 of the movable body 46. Thus, the intermediate side-surface pressurizing bodies 321 apply force to the movable body 46 inward.

The bottom of the intermediate piezoelectric base 31 comes into contact with the seating surface 241 formed on the upper surface of the central portion of the main-body piezoelectric base 21. The bottom of the movable body 46 comes into contact with an intermediate seating surface 341 formed on an upper surface of a central portion of the intermediate piezoelectric base 31.

Here, these parts may make surface contact with each other, or the bottom of the intermediate piezoelectric base 31 or the movable body 46 may come into contact with protruding bottom support parts provided on the corresponding seating surface, as shown in the drawings. Each bottom support part 24 of the seating surface 241 making contact with the intermediate piezoelectric base 31 or each intermediate bottom support part 34 of the intermediate seating surface 341 making contact with the movable body 46 may have a simple hemispheric shape or protrusion shape.

Figure 7:
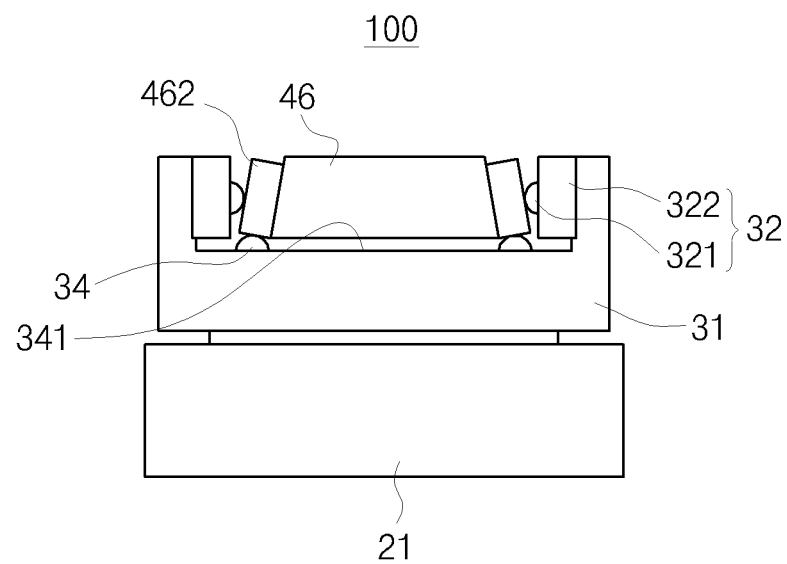
FIG. 7 is a view illustrating the coupling relationship between a intermediate piezoelectric base of a micro stage and a movable body having an inclined-surface guide according to still another embodiment of the present invention.

The embodiment of FIG. 7 uses the principle of the embodiment of FIG. 2, wherein the movable body also functions as an intermediate piezoelectric base. Unlike the embodiment of FIG. 6, inclined-surface guides 462 each forming a downward and outward inclined surface are provided on the respective opposite sides of the movable body 46. Differences between the embodiments of FIGS. 6 and 7 are the same as those between the embodiments of FIGS. 1 and 2. In this embodiment, each inclined-surface guide 462 has a rectangular cross-section, and each of the opposite side surfaces of the movable body 46 that respectively make contact with the inclined-surface guides 462 forms a downward and outward inclined surface. Consequently, the outer surface of each inclined-surface guide 462 also forms a downward and outward inclined surface. Alternatively, the opposite side surfaces of the movable body 46 may be vertical while only the outer surface of each of the inclined-surface guides 462 coupled to the respective opposite side surfaces of the movable body 46 may form an downward and outward inclined surface. In other words, the coupling of the inclined-surface guides 462 to the opposite side surfaces of the movable body 46 can be embodied in a variety of shapes so long as the outer surface of each inclined-surface guide 462 can be inclined downward and outward.

Other than the above-mentioned characteristics of the micro stage 100 of FIG. 7, the construction and operation of the micro stage 100 of FIG. 7 is similar or equal to that of the embodiment of FIG. 6. Therefore, further explanation is deemed unnecessary.

Figure 8:
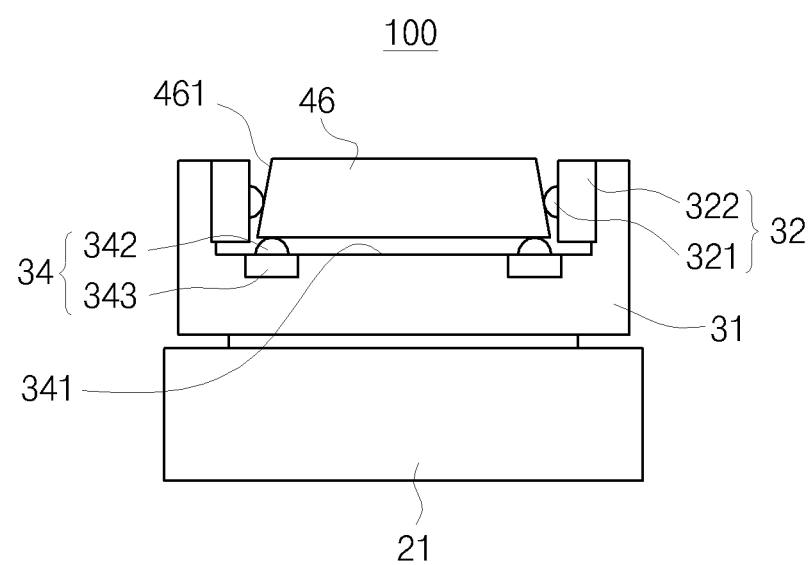
FIG. 8 is a view illustrating a micro stage in which an intermediate bottom support part is provided on an intermediate piezoelectric base according to still another embodiment of the present invention.

FIG. 8 illustrates an embodiment in which at least one pair of intermediate bottom piezoelectric elements 343, each coupled to an intermediate bottom pressurization body 342, is provided and oriented in the intermediate piezoelectric base 31. In detail, as shown in FIG. 8, intermediate bottom support parts 34 are provided on an intermediate seating surface 341 of the intermediate piezoelectric base 31 for supporting the bottom of the movable body 46. Each intermediate bottom support part 34 includes the intermediate bottom pressurization body 342 making contact with the movable body 46, and the intermediate bottom piezoelectric element 343 provided to move the intermediate bottom pressurization body 342. Desirably, the intermediate bottom piezoelectric element 343 comprises a piezoelectric element that is operated in a shear mode in the same manner as that of the piezoelectric element 222 described above.

In this embodiment, the movable body 46 that linearly moves relative to the intermediate piezoelectric base 31 is operated both by the intermediate side-surface pressurizing units 32 that are disposed on the opposite sides of the movable body 46 and linearly move and pressurize the movable body 46, and by the intermediate side-surface piezoelectric elements 322 and the intermediate bottom piezoelectric elements 343 of the intermediate bottom support parts 34 that support the bottom of the movable body 46. Therefore, the linear movement of the movable body 46 relative to the intermediate piezoelectric base 31 can be conducted more reliably and precisely.

Figure 9:
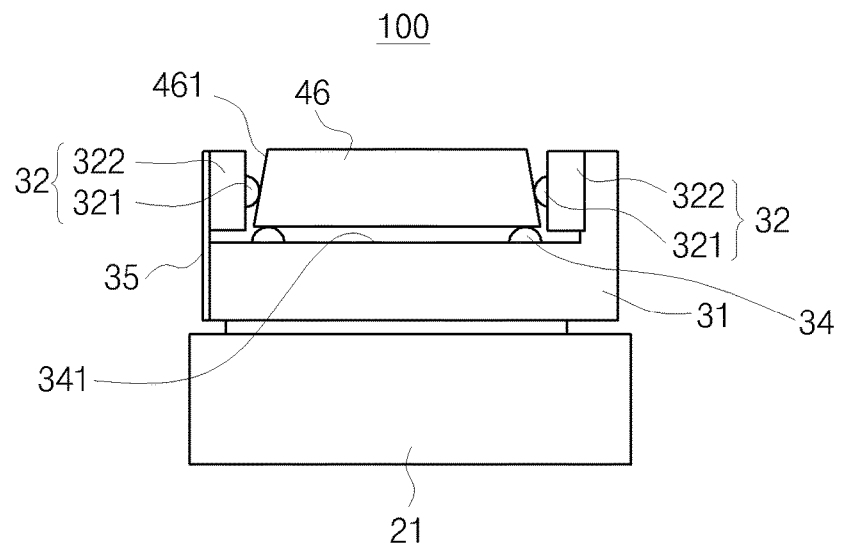
FIG. 9 is a view illustrating a micro stage in which an elastic part is provided on an intermediate piezoelectric base according to still another embodiment of the present invention.

FIG. 9 illustrates an embodiment that is further provided with an elastic part to elastically pressurize the movable body inward.

In this embodiment, the intermediate side-surface pressurizing unit 32 is coupled to the intermediate piezoelectric base 31 by the elastic part 35. The elastic part 35 may be provided only on either side of the intermediate piezoelectric base 31 or on each of the opposite sides thereof. The elastic part 35 elastically pushes the corresponding intermediate side-surface pressurizing unit 32 toward the movable body 46 that is disposed between the intermediate side-surface pressurizing units 32. The elastic part 35 may be separately manufactured having a thin plate spring structure and then coupled to the intermediate piezoelectric base 31. Alternatively, the elastic part 35 may be integrally formed with the intermediate piezoelectric base 31.

Corresponding to the embodiment of FIG. 5, FIG. 10 illustrates an embodiment that further includes an inward pressurizing piezoelectric element, which is provided on the side-surface pressurizing body of either of the side-surface pressurizing units and pressurizes the movable body inward or releases it depending on whether electricity is supplied or not.

In this embodiment, the intermediate side-surface pressurizing unit 32 that transversely pressurizes and moves the movable body 46 further includes an intermediate-inward-pressurizing piezoelectric element 323 that is provided on the intermediate side-surface piezoelectric element 322 and is operated in the longitudinal mode. The intermediate-inward-pressurizing piezoelectric element 323 may also be disposed on either side of the movable body or on each of the opposite sides thereof.

Meanwhile, a particle emission source, an electronic lens or an electronic lens layer(s) of a particle beam column such as a microelectronic column (micro column) may be provided in the movable body of the micro stage according to each of the embodiments of the present invention. In this case, the particle beam column in which the particle emission source, the electronic lens, or the like are installed in the micro stage of the present invention can be manufactured. If such a particle beam column is manufactured, high-precise movement of the particle emission source, the electronic lens, etc. is embodied by means of the micro stage of the present invention, whereby optical axis adjustment of the lens and the particle emission source of the particle beam column can be markedly facilitated.

The particle emission source, the electronic lens, or the electronic lens may be installed in the movable body of the micro stage of every embodiment of the present invention or may be mounted to the surface of the movable body. In the case of being installed in the movable body, a wire reception hole for wiring from the particle emission source is desirably formed an internal or side-surface through hole in at least one of the main-body piezoelectric base and the intermediate piezoelectric base of the micro stage. More desirably, a through hole is formed along the central axes of the parts.

That is, the through hole for wiring without impeding the movement of the micro stage is formed in the central portions of the movable body, the main-body piezoelectric base, and the intermediate piezoelectric base. Via a feedthrough for a vacuum chamber, wires are desirably connected to a control system, which is disposed outside the vacuum chamber.

If the particle emission source is mounted to the surface of the movable body, it must be reliably fixed, and wires must also reliably fixed in place by means of the wire reception hole or a separate fastener to prevent the wires from impeding the movement of the micro stage.

In the case where the electronic lens or the electronic lens layer is installed, through holes must be formed in the movable body, the main-body piezoelectric base and the intermediate piezoelectric base so as to form a path for passing a particle beam as well as a path for wiring.

Furthermore, contact portions of the side-surface pressurizing unit, the bottom pressurization body, the inclined surface guide, the intermediate bottom pressurization body, the inclined-surface guide, etc. may be made of ruby, alumina, sapphire, steel or the like and desirably made of material capable of ensuring normal operation without changing in conditions or characteristics even in a vacuum environment.

Hereinafter, an operation embodiment of the micro stage 100 using a piezoelectric element according to the present invention having the above-mentioned construction will be described. Although the operation embodiment of the micro stage 100 will be explained based on the embodiment of FIG. 5 with reference to FIG. 10, those skilled in this art can easily understand that it can also be applied to the other embodiments.

First, a process of moving the intermediate piezoelectric base 31 relative to the main-body piezoelectric base 21 will be described.

With regard to the installation state of the micro stage, a first side portion of the main-body piezoelectric base 21 protrudes upwards. The inward pressurizing piezoelectric element 223, the side-surface piezoelectric element 222 and the hemispheric side-surface pressurizing body 221 protrude inward from the first side portion of the main-body piezoelectric base 21, thus forming the side-surface pressurizing unit 22 on the first side portion of the main-body piezoelectric base 21.

The hemispheric bottom support parts 24 are provided on the seating surface 241 formed on the upper surface of the central portion of the main-body piezoelectric base 21.

The intermediate piezoelectric base 31 is disposed such that: a left portion of the intermediate piezoelectric base 31 comes into contact with the side-surface pressurizing unit 22 that is provided on the left portion of the main-body piezoelectric base 21; and the bottom of the intermediate piezoelectric base 31 makes contact with the bottom support parts 24.

Subsequently, the other side-surface pressurizing unit 22 is coupled to a second side portion of the main-body piezoelectric base 21.

The side-surface pressurizing unit 22 that comes into contact with a right portion of the intermediate piezoelectric base 31 includes the inward pressurizing piezoelectric element 223, the side-surface piezoelectric element 222, and the hemispheric side-surface pressurizing body 221 that makes contact with the right portion of the intermediate piezoelectric base 31.

In this assembly state, the opposite side surfaces and the bottom of the intermediate piezoelectric base 31 are covered with the parts coupled to the main-body piezoelectric base 21. In addition, each of the opposite side surfaces of the intermediate piezoelectric base 31 comprises a downward and outward inclined surface. Consequently, with regard to four directions including upward, downward, leftward and rightward, among the six degrees of freedom, the movement of the intermediate piezoelectric base 31 is restricted.

As the voltage applied to the shear mode piezoelectric element 222 gradually increases from 0 V to several tens or hundreds of V, a free surface of the shear mode piezoelectric element that is opposite to a fixed surface thereof is moved by shear force along with the movable body 46 that is brought into close contact with the free surface of the shear mode piezoelectric element. In this state, when the applied voltage is momentarily dropped to 0 V, only the shear mode piezoelectric element 222 and the side-surface pressurizing body 221 return to their initial positions, and the movable body 46 remains at the last position because of the law of inertia. When such voltage applying operations are successively conducted, the movable body 46 is linearly moved forward. To move the movable body 46 in the reverse direction, operations of applying voltage from 0 V to minus several tens or hundreds of V have only to be successively conducted. As such, the stage using the shear mode piezoelectric element according to the present invention can continuously move the movable body without restriction. Therefore, as the length of the movable body is increased, the distance of movement of the stage is also increased. When voltage is applied to the inward pressurizing piezoelectric element 223, the intermediate piezoelectric base 31 is pushed in the transverse direction by the characteristics of the inward pressurizing piezoelectric element 223 that is operated in the longitudinal mode. Thereby, the contact force between the main-body piezoelectric base 21 and the intermediate piezoelectric base 31 is increased.

Thereafter, when voltage is applied to each of the shear mode side-surface piezoelectric elements 222 that are provided on the opposite sides of the main-body piezoelectric base 21, the side-surface pressurizing body 221 and the intermediate piezoelectric base 31 are moved in the transverse direction (forward or rearward in FIG. 5).

Subsequently, when the voltage that has been applied to the inward pressurizing piezoelectric element 223 is interrupted, the force that has been applied to the intermediate piezoelectric base 31 is reduced. At this time, when the voltage that has been applied to the side-surface piezoelectric element 222 is also interrupted, only the side-surface pressurizing body 221 returns to its original position while the intermediate piezoelectric base 31 remains at the last position. Therefore, the intermediate piezoelectric base 31 is moved by a predetermined distance relative to the main-body piezoelectric base 21 in a piezoelectric operation manner.

A process of moving the movable body 46 relative to the intermediate piezoelectric base 31 will be described in detail below.

With regard to the installation state of the micro stage, a first side portion (that is, a left portion in FIG. 10) of the intermediate piezoelectric base 31 protrudes upwards. The intermediate-inward-pressurizing piezoelectric element 323, the intermediate side-surface piezoelectric element 322, and the hemispheric intermediate side-surface pressurizing body 321 protrude inward from the first side portion of the intermediate piezoelectric base 31, thus forming the side-surface pressurizing unit 22 on the first side portion (the left portion of FIG. 10) of the intermediate piezoelectric base 31.

The intermediate bottom support parts 34 are provided on the intermediate seating surface 341 formed on the upper surface of the central portion of the intermediate piezoelectric base 31.

The movable body 46 is disposed such that: the left side surface of the movable body 46 comes into contact with the intermediate side-surface pressurizing unit 32 provided on the left portion of the intermediate piezoelectric base 31; and the bottom of the movable body 46 comes into contact with the intermediate bottom support part 34.

Subsequently, the other intermediate side-surface pressurizing unit 32 (disposed at the right portion of FIG. 10) is coupled to a right portion of the intermediate piezoelectric base 31 (refer to FIG. 10).

The intermediate side-surface pressurizing unit 32 that comes into contact with the left side surface of the movable body 46 includes the intermediate-inward-pressurizing piezoelectric element 323, the intermediate side-surface piezoelectric element 322, and the hemispheric intermediate side-surface pressurizing body 321 that makes contact with the left side surface of the movable body 46.

In this assembly state, the opposite side surfaces and the bottom of the movable body 46 are covered with the parts coupled to the intermediate piezoelectric base 31. In addition, each of the opposite side surfaces of the movable body 46 comprises a downward and outward inclined surface. Consequently, with regard to four directions including upward, downward, leftward and rightward among the six degrees of freedom, the movement of the movable body 46 is restricted.

When voltage is applied to the intermediate-inward-pressurizing piezoelectric element 323 that makes contact with the intermediate elastic part 35, the movable body 46 is compressed in the transverse direction by the characteristics of the intermediate-inward-pressurizing piezoelectric element 323 that is operated in the longitudinal mode. Thereby, the contact force between the intermediate piezoelectric base 31 and the movable body 46 is increased.

Thereafter, when voltage is applied to each of the shear mode intermediate side-surface piezoelectric elements 322 that are provided on the opposite sides of the intermediate piezoelectric base 31, the intermediate side-surface pressurizing body 321 and the movable body 46 are moved in the transverse direction.

Subsequently, when the voltage that has been applied to the intermediate-inward-pressurizing piezoelectric element 323 is interrupted, the force that has been applied to the movable body 46 is reduced. At this time, when the voltage that has been applied to the intermediate side-surface piezoelectric element 322 is also interrupted, only the intermediate side-surface pressurizing body 321 returns to its original position while the movable body 46 remains at the last position. Therefore, the movable body 46 is moved by a predetermined distance relative to the intermediate piezoelectric base 31 in a piezoelectric operation manner.

Therefore, a sample or the like that is placed on the movable body 46 can be moved relative to the main-body piezoelectric base 21 in biaxial directions including the X-axis and Y-axis. As a result, the micro stage 100 according to the present invention can rapidly, precisely, and reliably move the sample in a desired direction.

As described above, the present invention provides a micro stage that uses a piezoelectric element as an actuator. The micro stage can be reliably operated with nanometer-level precision even in a vacuum environment.

Furthermore, the micro stage of the present invention is configured such that the distance between the piezoelectric element and moving parts can be maximally reduced, whereby the micro stage can be precisely operated.

The piezoelectric element according to the present invention can continuously move a movable body so that there is no limit in the distance of movement of the micro stage There is no need for applying voltage to the piezoelectric element in a stationary state because the micro stage can be physically stable.

Furthermore, in the present invention, a downward and outward inclined surface is formed on each of the opposite sides of the movable body that moves a target. Therefore, force applied from both side-surface pressurizing units to the movable body also pushes the movable body downward, thus preventing a gap between the movable body and a base from occurring while the movable body moves.

Moreover, in the present invention, the piezoelectric element is used to move a particle emission source, so that the movement and operation of the particle emission source can become more reliable.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A micro stage comprising a movable body provided to move a target, and a main-body piezoelectric base to which the movable body is movably coupled,
    wherein the main-body piezoelectric base comprises side-surface pressurizing units for pressurizing the movable body,
    the movable body has inclined surfaces on portions thereof coming into contact with the respective side-surface pressurizing unit of the main-body piezoelectric base,
    the one or more side-surface pressurizing units comprise a side-surface pressurizing body pressurizing the movable body, a side-surface piezoelectric element coming into contact with the side-surface pressurizing body in order to move the movable body, and an inward pressurizing piezoelectric element provided on the side-surface piezoelectric element in order to press the side-surface pressurizing body toward the movable body,
    the inward pressurizing piezoelectric element that makes contact with the side-surface piezoelectric element is operated in a longitudinal mode and pressurizes and releases the movable body by depending on supply of voltage to the inward pressurizing piezoelectric element, and the side-surface piezoelectric element is operated in a shear mode and transversely moves the movable body, and
    pressurizing force is applied from the opposite side-surface pressurizing units of the main-body piezoelectric base to opposite sides of the movable body and thus pressurizes the movable body in an inclined direction so that the movable body is pressurized onto the main-body piezoelectric base while the movable body is moved.

2. The micro stage as set forth in claim 1, further comprising any one of or both:
    an inclined-surface guide bonded to one side or each of both sides of the movable body, the inclined-surface guide forming a downward and outward inclined surface and coming into contact with the corresponding side-surface pressurizing unit of the main-body piezoelectric base; and
    a bottom support part provided on a contact surface of the main-body piezoelectric base that makes contact with the movable body, the bottom support part supporting a bottom of the movable body.

3. The micro stage as set forth in claim 2, wherein the bottom support part comprises:
    a bottom pressurizing body coming into contact with the bottom of the movable body; and
    a bottom piezoelectric element disposed between the bottom pressurizing body and a seating surface of the main-body piezoelectric base.

4. The micro stage as set forth in claim 1, wherein the side-surface pressurizing unit further comprises
    an elastic part pressurizing the side-surface pressurizing body toward the movable body.

5. The micro stage as set forth in claim 2, wherein the side-surface pressurizing unit further comprises
    an elastic part pressurizing the side-surface pressurizing body toward the movable body.

6. The micro stage as set forth in claim 3, wherein the side-surface pressurizing unit further comprises
    an elastic part pressurizing the side-surface pressurizing body toward the movable body.

7. The micro stage as set forth in claim 1, wherein the bottom support part comprises:
    a bottom pressurizing body coming into contact with the bottom of the movable body; and
    a bottom piezoelectric element disposed between the bottom pressurizing body and a seating surface of the main-body piezoelectric base.

8. The micro stage as set forth in claim 7, wherein the side-surface pressurizing unit further comprises
    an elastic part pressurizing the side-surface pressurizing body toward the movable body.

* * * * *